(12) United States Patent
Wardzala et al.

(10) Patent No.: US 7,257,281 B2
(45) Date of Patent: Aug. 14, 2007

(54) METHOD FOR FABRICATING THICK FILM ALUMINA STRUCTURES USED IN HIGH FREQUENCY, LOW LOSS APPLICATIONS AND A STRUCTURE RESULTING THEREFROM

(75) Inventors: Leonard J. Wardzala, Burlington, WI (US); Gregory A. Ballard, Belvidere, IL (US); Kurt B. Friel, Sycamore, IL (US)

(73) Assignee: Lucent Technologies Inc., Murray Hill, NJ (US)

( * ) Notice: Subject to any disclaimer, the term of this patent is extended or adjusted under 35 U.S.C. 154(b) by 254 days.

(21) Appl. No.: 10/462,447

(22) Filed: Jun. 16, 2003

(65) Prior Publication Data

US 2004/0251230 A1    Dec. 16, 2004

(51) Int. Cl.
*G02B 6/12* (2006.01)
*G02B 6/00* (2006.01)
*B23P 17/00* (2006.01)

(52) U.S. Cl. .................. 385/14; 385/147; 29/424

(58) Field of Classification Search ............... 385/147; 29/424
See application file for complete search history.

(56) References Cited

U.S. PATENT DOCUMENTS

| 5,316,985 | A * | 5/1994 | Jean et al. ................... 501/16 |
| 6,909,589 | B2 * | 6/2005 | Huff ........................... 361/281 |
| 2004/0061234 | A1 * | 4/2004 | Shah et al. .................. 257/758 |
| 2005/0108875 | A1 * | 5/2005 | Mathieu et al. ............... 29/852 |
| 2005/0146039 | A1 * | 7/2005 | Shah et al. .................. 257/758 |
| 2005/0161826 | A1 * | 7/2005 | Shah et al. .................. 257/758 |
| 2005/0236180 | A1 * | 10/2005 | Sarma et al. ................ 174/256 |

* cited by examiner

*Primary Examiner*—K. Cyrus Kianni

(57) ABSTRACT

A method for fabricating thick film alumina structures used in high frequency, low loss applications is provided. More particularly, the invention is directed to a co-fire process for fabricating, or laminating, thick film structures to one another by printing a conductor layer between two thick film circuits, drying the layer, and co-firing the combined structure. This process is particularly useful in fabricating high frequency (e.g. 10 gigabit) fiber optic transmitters.

18 Claims, 2 Drawing Sheets

(a)

(b)

(c)

(a)

(b)

(c)

METHOD FOR FABRICATING THICK FILM ALUMINA STRUCTURES USED IN HIGH FREQUENCY, LOW LOSS APPLICATIONS AND A STRUCTURE RESULTING THEREFROM

BACKGROUND OF THE INVENTION

This invention relates to a method for fabricating thick film alumina structures used in high frequency, low loss applications and a structure resulting therefrom. More particularly, the invention is directed to a co-fire process for fabricating, or laminating, thick film structures to one another by printing a conductor layer between two thick film circuits, drying the layer, and co-firing the combined structure. This process is particularly useful in fabricating high frequency (e.g. 10 gigabit) fiber optic transmitters.

While the invention is particularly directed to the art of fabricating thick film alumina structures used in high frequency, low loss applications, and will be thus described with specific reference thereto, it will be appreciated that the invention may have usefulness in other fields and applications. For example, principles of the invention may be used in any application where an alternative to LTCC (low temperature, co-fired ceramic) processes is desired.

By way of background, within the ceramics industry, there are primarily two technologies used for fabricating multi-layer ceramic structures: thick film (on 96% alumina) processes and LTCC (low temperature co-fired ceramic) processes. Thick film processes have historically been the dominant technology.

In this regard, thick film processes have many advantages over LTCC processes. For example, thick film processes are traditionally conducted by established manufacturers with established supply chains. As such, there is lower cost in implementing these processes. From a performance standpoint, thick film processes result in lower loss for high frequency structures. In addition, thick film processes result in structures having greater thermal conductivity.

There are also disadvantages to the use of thick film processes. For multi-layer circuits used in high frequency applications, thick film processes result in poor performance of the structure. Additionally, since dielectrics can only be printed, thick film processes are limited to using a thin dielectric layer. The thin dielectric layer limits the types of high frequency structures that can actually be built.

Likewise, LTCC processes have advantages and disadvantages. For example, LTCC processes have at least some performance advantages over other technologies; however, LTCC processes require a large capital investment on the part of the manufacturer. As to disadvantages in performance, LTCC processes typically result in higher loss ratios than thick film technology for the structure fabricated. Moreover, LTCC tape is typically not available in comparable alumina thickness, thereby requiring more layers of tape to realize an equivalent thickness in alumina. Still further, LTCC processes typically result in shrinkage of fabricated elements. This shrinkage is, of course, not desired and must be compensated for in the design.

Accordingly, it is desirable to implement a process that realizes the benefits of both thick film processes and LTCC processes. However, no such process was heretofore available.

The present invention contemplates a new and improved process for fabricating thick film alumina structures used in high frequency, low loss applications that resolves the above-referenced difficulties and others.

SUMMARY OF THE INVENTION

A method for fabricating thick film structures used in high frequency, low loss applications is provided. A useful structure results from the implementation of the method.

In one aspect of the invention, the method comprises steps of fabricating circuit layers on a first side of a first ceramic substrate to obtain a first circuit subassembly, fabricating other circuit layers on a first side of a second ceramic substrate to obtain a second circuit subassembly, printing a first metal layer on selected portions of a second side of the first ceramic substrate, drying the first metal layer, printing a second metal layer on selected portions of a second side of the second ceramic substrate, drying the second metal layer, printing a third metal layer on the second metal layer, aligning the first metal layer with the third metal layer, placing the first circuit subassembly on the second circuit subassembly to form a resultant assembly based on the aligning, drying the third metal layer and firing the resultant assembly.

In another aspect of the invention, the method comprises printing a first metal layer on selected portions of a first ceramic substrate, drying the first metal layer, printing a second metal layer on selected portions of a second ceramic substrate, drying the second metal layer, printing a third metal layer on the second metal layer, aligning the first metal layer with the third metal layer, placing the first ceramic substrate on the second ceramic substrate to form a resultant assembly based on the aligning, drying the third metal layer and firing the resultant assembly.

In another aspect of the invention, an apparatus is fabricated using the method, the apparatus comprising a first ceramic subassembly having a first circuit fabricated on a first side thereof and a second ceramic subassembly having a second circuit fabricated on a first side thereof, wherein the first ceramic subassembly is joined to the second ceramic subassembly by metal layers that are selectively printed on one of a second side of the first ceramic subassembly and a second side of the second ceramic subassembly, dried and co-fired.

In another aspect of the invention, the ceramic layers are fabricated of 96% alumina.

In another aspect of the invention, the first, second and third metal layers are fabricated of a platinum and silver alloy.

In another aspect of the invention, the first, second and third metal layers are fabricated of silver.

In another aspect of the invention, the first, second and third metal layers are fabricated of gold.

In another aspect of the invention, the first, second and third metal layers are fabricated of a thick film cermet material.

In another aspect of the invention, the cermet material has a firing range of 500° Celsius to 950° Celsius.

In another aspect of the invention, the resultant assembly is a fiber optic transmitter.

In another aspect of the invention, the resultant assembly includes a step.

Further scope of the applicability of the present invention will become apparent from the detailed description provided below. It should be understood, however, that the detailed description and specific examples, while indicating preferred embodiments of the invention, are given by way of illustration only, since various changes and modifications within the spirit and scope of the invention will become apparent to those skilled in the art.

DESCRIPTION OF THE DRAWINGS

The present invention exists in the construction, arrangement, and combination of the various parts of the device, and steps of the method, whereby the objects contemplated are attained as hereinafter more fully set forth, specifically pointed out in the claims, and illustrated in the accompanying drawings in which:

DETAILED DESCRIPTION OF THE PREFERRED EMBODIMENTS

Figure 1:
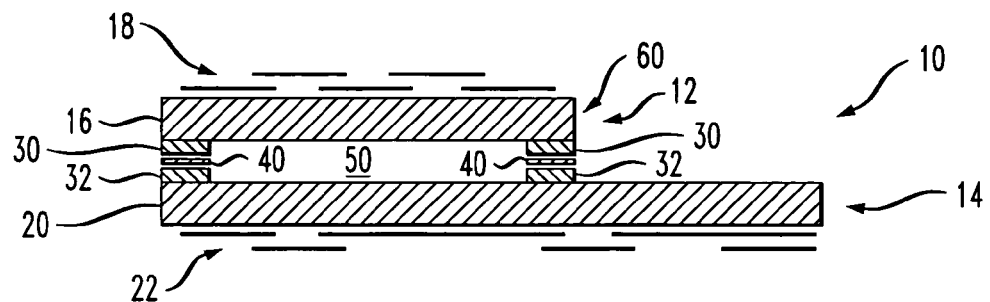
FIG. 1 illustrates a cross-sectional view of a ceramic assembly or structure fabricated according to a method of the present invention.

Referring now to the drawings wherein the showings are for purposes of illustrating the preferred embodiments of the invention only and not for purposes of limiting same, FIG. 1 provides a view of an assembly fabricated according to a method of the present invention. The assembly shown may be useful in many high frequency, low loss environments; however, it finds particular application as a high frequency fiber optic transmitter, where low loss is a primary objective.

As shown, a ceramic assembly 10 includes a first circuit subassembly 12 and a second circuit subassembly 14. The first circuit subassembly 12 includes a first ceramic substrate 16 having a circuit portion, or circuit layers, 18 fabricated on a first side thereof. Metallization layer(s) 30 are also fabricated on a second side of the ceramic substrate 16. It should be understood that the precise form or pattern of the metallization layer(s) 30 (as well as layers 32 and 40) will vary depending on the configuration of the ultimate structure. For example, it may be a single continuous layer, multiple layers, a discontinuous layer or separate portions of material applied in the same plane, as shown in FIG. 1.

The second circuit subassembly 14 includes a ceramic substrate 20 having a circuit portion, or circuit layers, 22 fabricated thereon. The circuit portion 22 is disposed on a first side of the ceramic substrate 20. Metallization layers 32 are fabricated on a second side of the substrate, as shown.

Metallization layer(s) 40 are disposed in a place between the layers 30 and 32. It is to be understood that, as described below, the layer(s) 40 is preferably fabricated on the layer(s) 32 of the second subassembly 14. However, it could be fabricated in other manners.

It is to be appreciated that a gap 50 exists between the first circuit subassembly 12 and the second circuit subassembly 14. This gap may be of any dimension, and may well not even be pertinent to operation of the circuit assembly. Therefore, the gap 50 could be minimized to a negligible dimension, depending on the thickness of the metal layers 30, 32 and 40.

It should also be noted that the structure, or assembly, 10 that is shown in FIG. 1, is merely representative of a variety of structures that could be fabricated. The structure shown is relatively simply in character to illustrate the aspects of the present invention and should not be considered to be limiting in nature. It should be noted, for example, that the present invention is particularly useful to form a step 60 as representatively shown in FIG. 1. However, more complex structures of this nature could be similarly fabricated using the present invention. For example, wells, cavities, channels or multi-layer steps may be fabricated using the present invention.

The ceramic substrate 16 and ceramic substrate 20 are preferably fabricated of 96% alumina, but could be fabricated of any suitable ceramic material. The circuit portions, or circuit layers, 18 and 22 can be fabricated on the appropriate sides of the substrates using a variety of methods. Preferably, the circuit layers 18 and 22 are fabricated using a print, dry, and fire (PDF) process. The printing portion of that process is preferably a screen printing process that can be accomplished in a number of manners that are accepted in the field. The drying process would include drying the material for a sufficient amount of time to prepare it for firing. Of course, firing the material should be accomplished over time intervals and in temperature ranges that are appropriate for the materials used in fabricating the circuit portions. Of course, any suitable material may be used for formation of the circuit portions.

The metallization layers 30, 32 and 40 are preferably fabricated of a platinum (Pt) and silver (Ag) alloy. It should be appreciated, however, that any suitable thick film cermet (ceramic-based metal material) conductor with a firing range of 500° C. to 950° C. may be used. There are a variety of industry standard conductor alloys that fall within this category of thick film metallization materials or conductors. For example, silver or gold could alternatively be used as the metallization layer. It should be appreciated, however, that for a particular structure being fabricated, it is preferred that all metal layers 30, 32 and 40 have the same composition.

The process for fabricating the assembly 10 of FIG. 1 can be accomplished by laminating, or joining, the two thick film circuit subassemblies 12 and 14 and selectively printing, drying and firing the structure. The process allows for formation of the structure without cracking the material. Moreover, the resultant structure forms an excellent electrical connection and realizes a variety of other practical and performance-based advantages. For example, the process does not require high capital investment. In addition, unlike known LTCC processes, the fabricated assembly does not experience any shrinkage during processing as a result of implementation of the invention. Moreover, the loss characteristics of the resultant assembly are favorable. Therefore, the resultant assembly is particularly suited for high frequency and low loss applications of thick film ceramic-based material. In this regard, as noted above, the present application is particularly suited to the formation of high frequency fiber optic transmitters.

Figure 2:
FIGS. 2(a)-(c) show a cross-sectional view of the steps for fabricating a subassembly according to the present invention.
Figure 2:
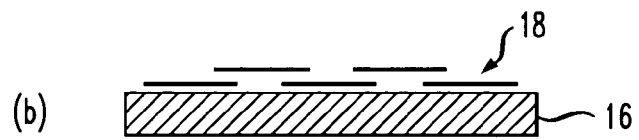
Figure 2:
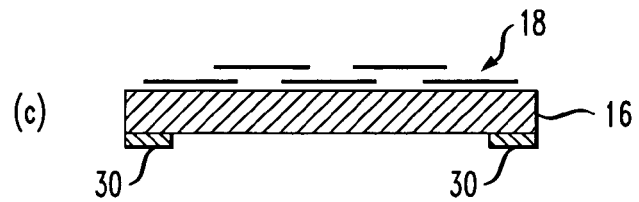

Referring now to FIG. 2, a method for fabricating the first circuit subassembly 12 is shown. In FIG. 2(a), the process begins by obtaining a ceramic substrate 16. As noted above, the ceramic substrate is preferably fabricated of 96% alumina. As shown in FIG. 2(b), circuit layers 18 are then fabricated on a first side of ceramic substrate 16 by any appropriate processes. Preferably, a print, dry and fire (PDF) process is used to do so. The materials selected may vary but such materials should be of a nature to withstand the processes contemplated by the implementation of the present invention. It should also be understood that the circuit portion 18 may take a variety of forms and/or patterns. Last, the metallization layer(s) 30 are fabricated on a second side of the substrate 16 by printing the metallization layer and allowing it to dry. The metallization layers are preferably printed by a suitable screen printing process. The drying period may vary from case to case. Notably, the metallization layers are not fired at this point.

Figure 3:
FIGS. 3(a)-(c) illustrate steps for fabricating a subassembly according to the present invention; and, FIGS. 4(a)-(c) illustrate steps for fabricating the ceramic assembly according the present invention.
Figure 3:
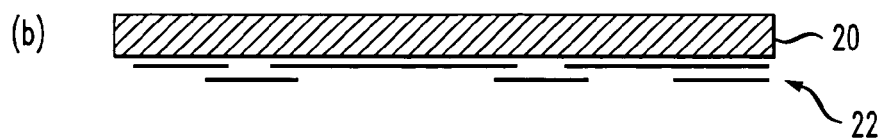
Figure 3:
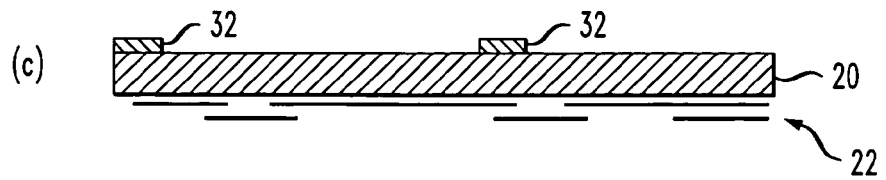

Referring now to FIG. 3, a method for fabricating the second circuit subassembly 14 is illustrated. As shown, in FIG. 3(a), a ceramic substrate 20 is first obtained. As noted above, the ceramic substrate is preferably fabricated of 96% alumina. FIG. 3(b) illustrates that a circuit portion, or circuit layers, 22 is appropriately fabricated on a first side of the substrate 20. As with circuit layers 18, the circuit layers 22 are fabricated using any known process; however, it is preferred that a circuit is fabricated using a print, dry and fire (PDF) process. The materials selected may vary but such materials should be of a nature to withstand the processes contemplated by the implementation of the present invention. It should also be understood that the circuit portion 22 may take a variety of forms and/or patterns. Last, as illustrated in FIG. 3(c), metallization layer(s) 32 are fabricated on the other side of the substrate 20. As indicated above, the metallization material may be any of a number of compositions; however, it should be the same as layer 30. The layer(s) 32 are printed and permitted to dry. The metallization layers are preferably printed by a suitable screen printing process. The drying period may vary from case to case. Notably, the metallization layers are not fired at this point.

Figure 4:
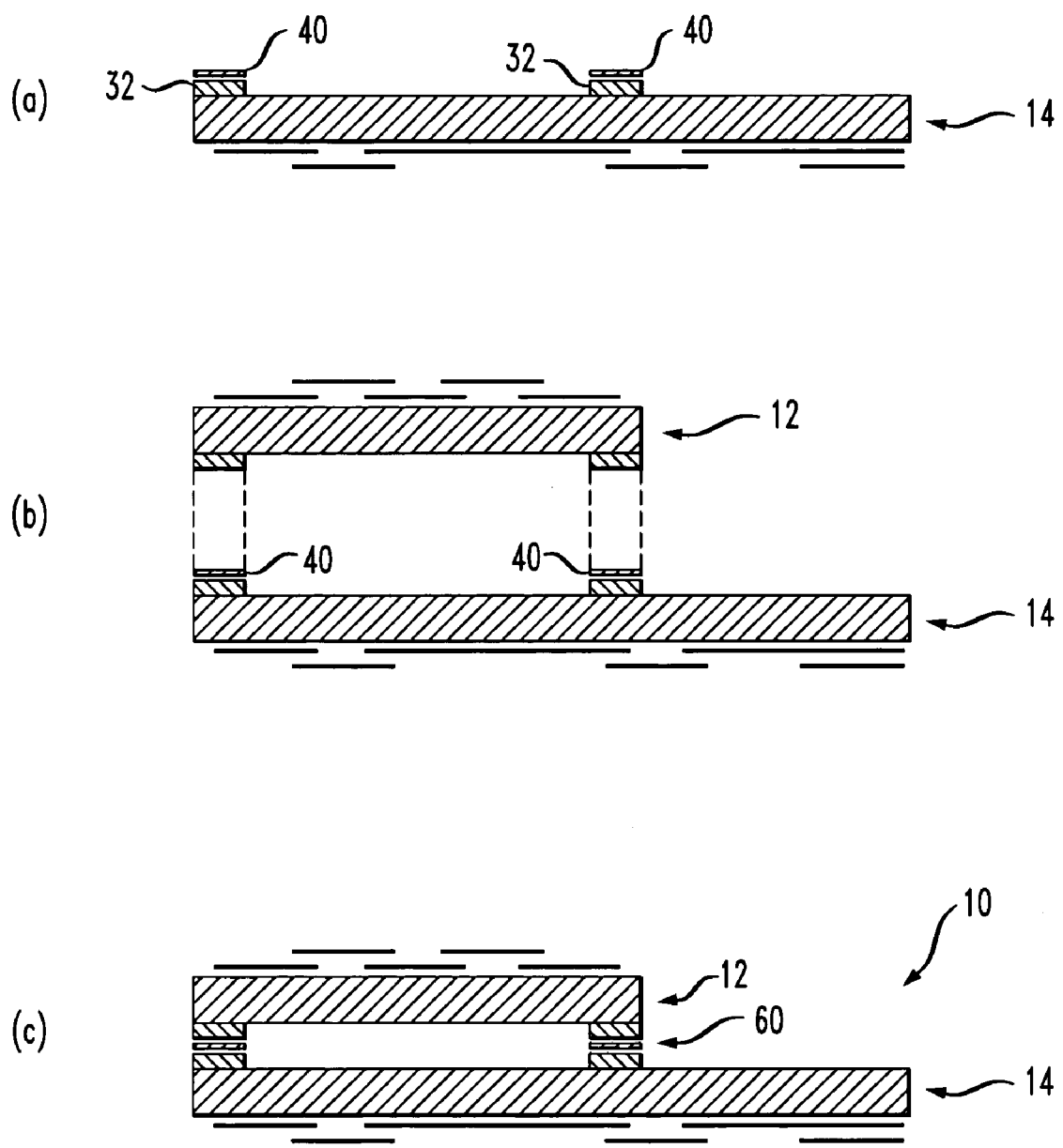

With reference to FIG. 4(a)-(c), the first circuit subassembly 12 and the second circuit subassembly 14 are then laminated, or joined together. More particularly, with reference to FIG. 4(a), a metallization layer 40 is printed on the metallization layer 32 of the circuit subassembly 14. Of course, the metallization layer 40 should be fabricated of the same material as layers 30 and 32. Again, screen printing is preferred. As shown in FIG. 4(b), the first circuit subassembly 12 is aligned, or fixtured, with the second circuit subassembly 14. In doing so, the metallization layer(s) 30 are aligned with the metallization layers 40, as shown. Any suitable alignment technique may be used to accomplish this objective. It should also be understood that the metallization layers 40 are not dried at this point in the process.

Referring now to FIG. 4(c), the first circuit subassembly 12 and the second circuit subassembly 14 are laminated, or joined together, based on the alignment of FIG. 4(b). The structure, particularly the metallization layers 40, is then permitted to dry and then fired, or co-fired, to obtain the final assembly 10. Any appropriate drying and co-firing process may be implemented so that the metallization layers 30, 32 and 40 form a sufficient bond for the resultant assembly. Note that the assembly 10 includes the step 60, as noted above.

As noted above, the drying and firing processes may vary from application to application. The precise time intervals and/or temperature ranges depend on the structures being formed and the materials. For example, when drying, a sufficient drying period may depend on the amount of ventilation that can occur so that the vehicle (or liquid) for the paste (or printed material) sufficiently evacuates. Preferably, the drying process is facilitated by providing vent holes in the ceramic structure. For firing, an 850° C. profile is preferably used; however, it should be understood that the firing of the structures is dependant on the material used.

It should also be understood that the process for fabricating a completed thick film ceramic assembly used as a circuit is illustrated. It should be appreciated the invention is not so limited, however. For example, the processes for fabricating the circuit layers 18 and 22 are not necessary as described for implementation of the present invention. Structures other than circuit layers may be suitably formed on the ceramic substrate. Alternatively, there may be applications where the ceramic substrates are first bonded using the present invention. Subsequent processes may then be used to form circuit portions or other structures on appropriate sides of the substrates. Moreover, applications using the present invention may not necessitate the formation of any additional circuit portions or other structures.

The above description merely provides a disclosure of particular embodiments of the invention and is not intended for the purposes of limiting the same thereto. As such, the invention is not limited to only the above-described embodiments. Rather, it is recognized that one skilled in the art could conceive alternative embodiments that fall within the scope of the invention.

We claim:

1. A method for fabricating high frequency, low loss structures, the method comprising steps of:
    fabricating circuit layers on a first side of a first ceramic substrate to obtain a first circuit subassembly;
    fabricating other circuit layers on a first side of a second ceramic substrate to obtain a second circuit subassembly;
    printing a first metal layer on selected portions of a second side of the first ceramic substrate;
    drying the first metal layer;
    printing a second metal layer on selected portions of a second side of the second ceramic substrate;
    drying the second metal layer;
    printing a third metal layer on the second metal layer;
    aligning the first metal layer with the third metal layer;
    placing the first circuit subassembly on the second circuit subassembly to form a resultant assembly based on the aligning;
    drying the third metal layer; and,
    firing the resultant assembly, wherein the resultant assembly is a fiber optic transmitter.

2. The method as set forth in claim 1 wherein the first ceramic layer is fabricated of 96% alumina.

3. The method as set forth in claim 1 wherein the second ceramic layer is fabricated of 96% alumina.

4. The method as set forth in claim 1 wherein the fabricating of the circuit layers comprises steps of printing, drying and firing the circuit layers.

5. The method as set forth in claim 1 wherein the fabricating of the other circuit layers comprises steps of printing, drying and firing the other circuit layers.

6. The method as set forth in claim 1 wherein the first, second and third metal layers are fabricated of a platinum and silver alloy.

7. The method as set forth in claim 1 wherein the first, second and third metal layers are fabricated of silver.

8. The method as set forth in claim 1 wherein the first, second and third metal layers are fabricated of gold.

9. The method as set forth in claim 1 wherein the first, second and third metal layers are fabricated of a thick film cermet material.

10. The method as set forth in claim 9 wherein the cermet material has a firing range of 500° Celsius to 950° Celsius.

11. The method as set forth in claim 1 wherein the resultant assembly includes a step.

12. A method for fabricating high frequency, low loss structures, the method comprising steps of:
    printing a first metal layer on selected portions of a first ceramic substrate;
    drying the first metal layer;
    printing a second metal layer on selected portions of a second ceramic substrate;
    drying the second metal layer;
    printing a third metal layer on the second metal layer;

aligning the first metal layer with the third metal layer;
placing the first ceramic substrate on the second ceramic substrate to form a resultant assembly based on the aligning;
drying the third metal layer; and,
firing the resultant assembly, wherein the resultant assembly is a fiber optic transmitter.

13. The method as set forth in claim 12 wherein the first, second and third metal layers are fabricated of a platinum and silver alloy.

14. The method as set forth in claim 12 wherein the first, second and third metal layers are fabricated of silver.

15. The method as set forth in claim 12 wherein the first, second and third metal layers are fabricated of gold.

16. The method as set forth in claim 12 wherein the first, second and third metal layers are fabricated of a thick film cermet material.

17. The method as set forth in claim 16 wherein the cermet material has a firing range of 500° Celsius to 950° Celsius.

18. The method asset forth in claim 12 wherein the resultant assembly includes a step.

* * * * *